(12) United States Patent
Yu et al.

(10) Patent No.: US 10,510,865 B2
(45) Date of Patent: Dec. 17, 2019

(54) CAP LAYER AND ANNEAL FOR GAPFILL IMPROVEMENT

(71) Applicant: Taiwan Semiconductor Manufacturing Co., Ltd., Hsinchu (TW)

(72) Inventors: De-Wei Yu, Ping Tung (TW); Chien-Hao Chen, Chuangwei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/952,512

(22) Filed: Apr. 13, 2018

(65) Prior Publication Data

US 2019/0319113 A1 Oct. 17, 2019

(51) Int. Cl.
*H01L 21/336* (2006.01)
*H01L 29/66* (2006.01)
*H01L 21/28* (2006.01)

(52) U.S. Cl.
CPC .. *H01L 29/66545* (2013.01); *H01L 21/28123* (2013.01); *H01L 29/66795* (2013.01)

(58) Field of Classification Search
CPC ......... H01L 21/76224; H01L 21/02532; H01L 21/02164; H01L 21/02595; H01L 29/66181; H01L 21/02271; H01L 21/0234; H01L 21/02667; H01L 21/02686; H01L 21/2022; H01L 21/2026; H01L 2924/0002; H01L 29/78675; H01L 31/182; H01L 21/02274; H01L 21/31; H01L 21/3121; H01L 21/3122; H01L 21/31608; H01L 21/76229; H01L 21/763; H01L 21/76828; H01L 21/76837; H01L 27/10861; H01L 27/1087; H01L 27/1285; H01L 2924/00; H01L 31/03685; H01L 31/1864; H01L 21/022; H01L 21/02216; H01L 21/02337; H01L 21/02348; H01L 21/0245; H01L 21/02502; H01L 21/02592; H01L 21/02609; H01L 21/0262; H01L 21/02645; H01L 21/0268; H01L 21/268; H01L 21/30604; H01L 21/31051; H01L 21/31612; H01L 21/32115; H01L 21/76825; H01L 21/76826; H01L 21/76832; H01L 21/76877; H01L 23/5329; H01L 27/10829; H01L 28/60; H01L 29/04; H01L 29/66757; H01L 31/0468;
(Continued)

(56) References Cited

U.S. PATENT DOCUMENTS 8,232,176 B2 7/2012 Lubomirsky et al.
2013/0075827 A1* 3/2013 Lee ..................... H01L 29/4966
257/369
(Continued)

*Primary Examiner* — Robert G Bachner
(74) *Attorney, Agent, or Firm* — Slater Matsil, LLP

(57) ABSTRACT

Embodiments disclosed herein relate generally to forming a gate layer in high aspect ratio trenches using a cyclic deposition-etch process. In an embodiment, a method for semiconductor processing is provided. The method includes performing a cyclic deposition-etch process to form a conformal film over a bottom surface and along sidewall surfaces of a feature on a substrate. The method includes forming a dielectric cap layer on the conformal film. The method includes performing an anneal process on the conformal film.

20 Claims, 15 Drawing Sheets

(58) Field of Classification Search
CPC . H01L 31/068; H01L 31/1872; C23C 16/045; C23C 16/401; C23C 16/56; C23C 16/30; C23C 16/45512; C23C 16/45523; C23C 16/505; C23C 16/509; C23C 16/52; G02F 1/13454; G02F 1/1368; G02F 2202/104
See application file for complete search history.

(56) References Cited

U.S. PATENT DOCUMENTS

| | | | |
|---|---|---|---|
| 2014/0120678 A1* | 5/2014 | Shinriki | H01L 29/66795 |
| | | | 438/283 |
| 2015/0060945 A1 | 3/2015 | Murthy et al. | |
| 2015/0372142 A1 | 12/2015 | Kuang et al. | |
| 2015/0380249 A1* | 12/2015 | Gouk | H01L 21/2254 |
| | | | 438/559 |
| 2017/0033178 A1* | 2/2017 | Krishnan | H01L 21/02675 |
| 2017/0271196 A1 | 9/2017 | Manna et al. | |
| 2018/0005870 A1 | 1/2018 | Hsu et al. | |
| 2018/0286672 A1* | 10/2018 | Van Aerde | H01L 21/02532 |
| 2019/0164850 A1* | 5/2019 | Lin | H01L 22/14 |

* cited by examiner

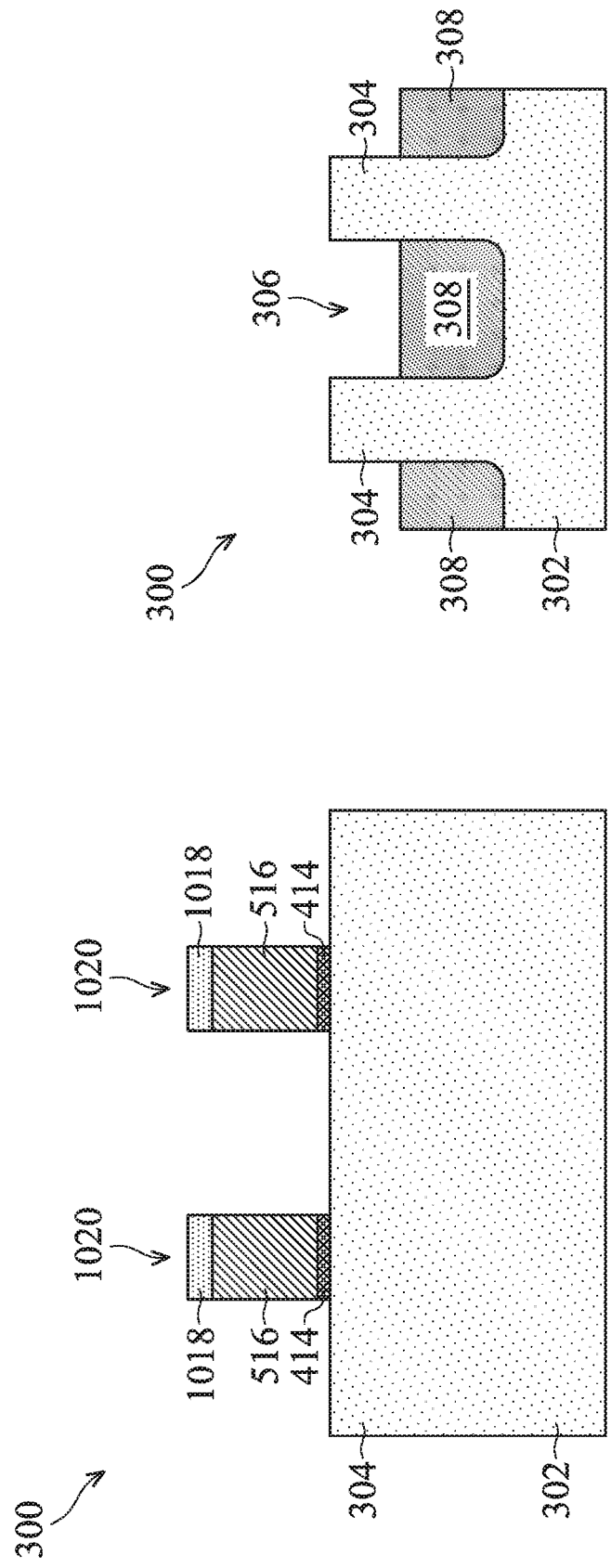

CAP LAYER AND ANNEAL FOR GAPFILL IMPROVEMENT

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. With the decreasing in scaling, however, it has been challenging to deposit a film in high aspect ratio trenches with small dimension without being presented problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 8, 9A-9B, 10A-10C, 11A-11B, 12A-12B, and 13A-13B illustrate various schematic three-dimensional and cross-sectional views of intermediate structures corresponding to various stages of fabrication according to some embodiments.

DETAILED DESCRIPTION

Figure 1:
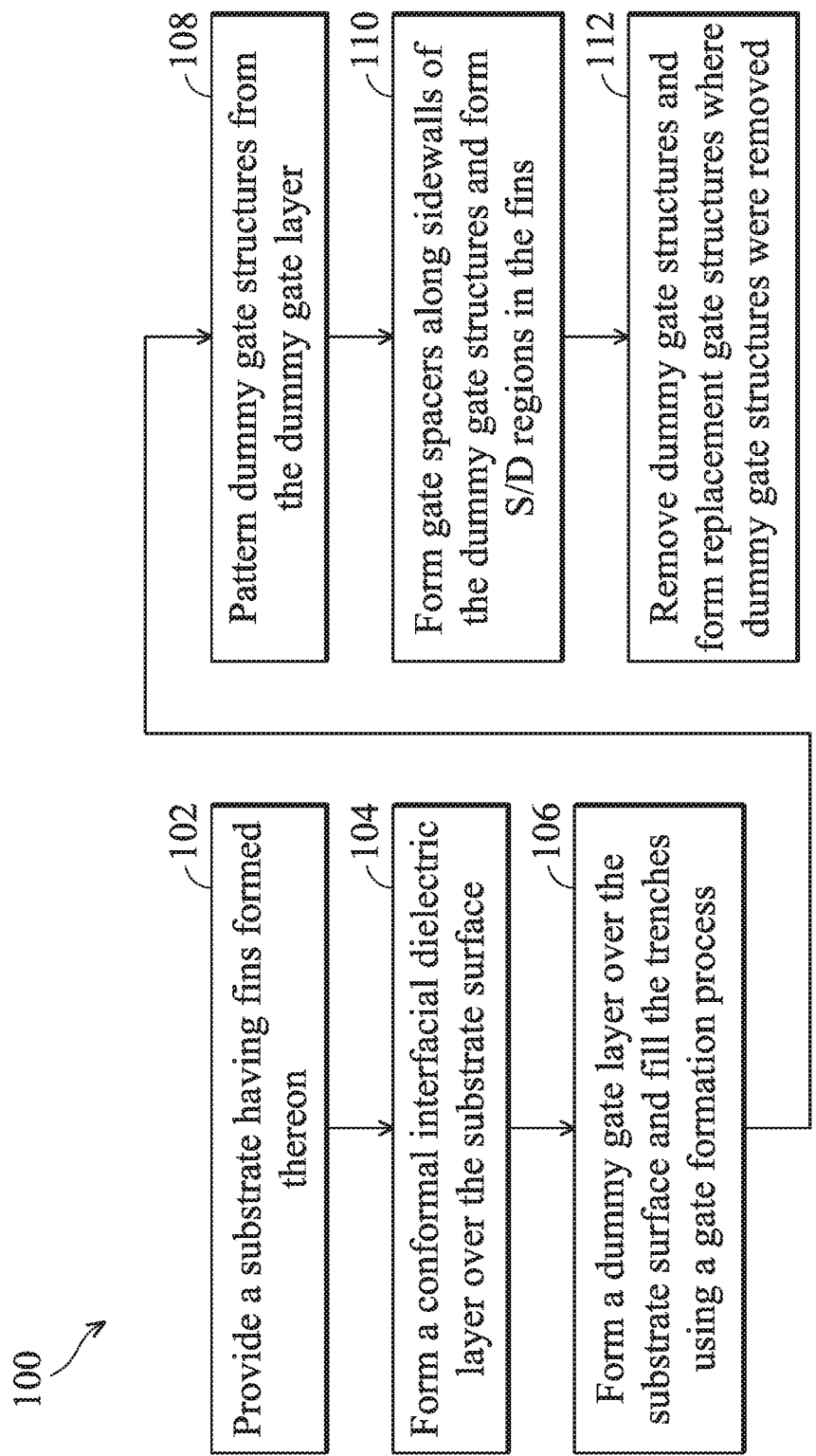
FIG. 1 is a flow chart illustrating an example method for fabricating a semiconductor device structure according to some embodiments.

The following disclosure provides many different embodiments, for examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to depositing a film or layer in semiconductor processing. Embodiments specifically described herein are in the context of depositing a film or layer in trenches between fins, which trenches can be a high aspect ratio. A cyclic deposition-etching process can be used to deposit the film or layer, which process can include depositing a portion of the film or layer, etching a portion of the film, and repeating the depositing and etching any number of times. After any number of cycles of the cyclic deposition-etching process, a cap layer formation process and an anneal process can be performed on the deposited layer. The cap layer formation and anneal processes can reduce or eliminate voids or seams in an amorphous silicon (a-Si) film or layer in the trench while reducing or avoiding crystallization of the a-Si film or layer during the anneal. Aspects of examples described herein can be applied to depositing a film or layer in any trench or recess, which may have a high aspect ratio.

Figure 2:
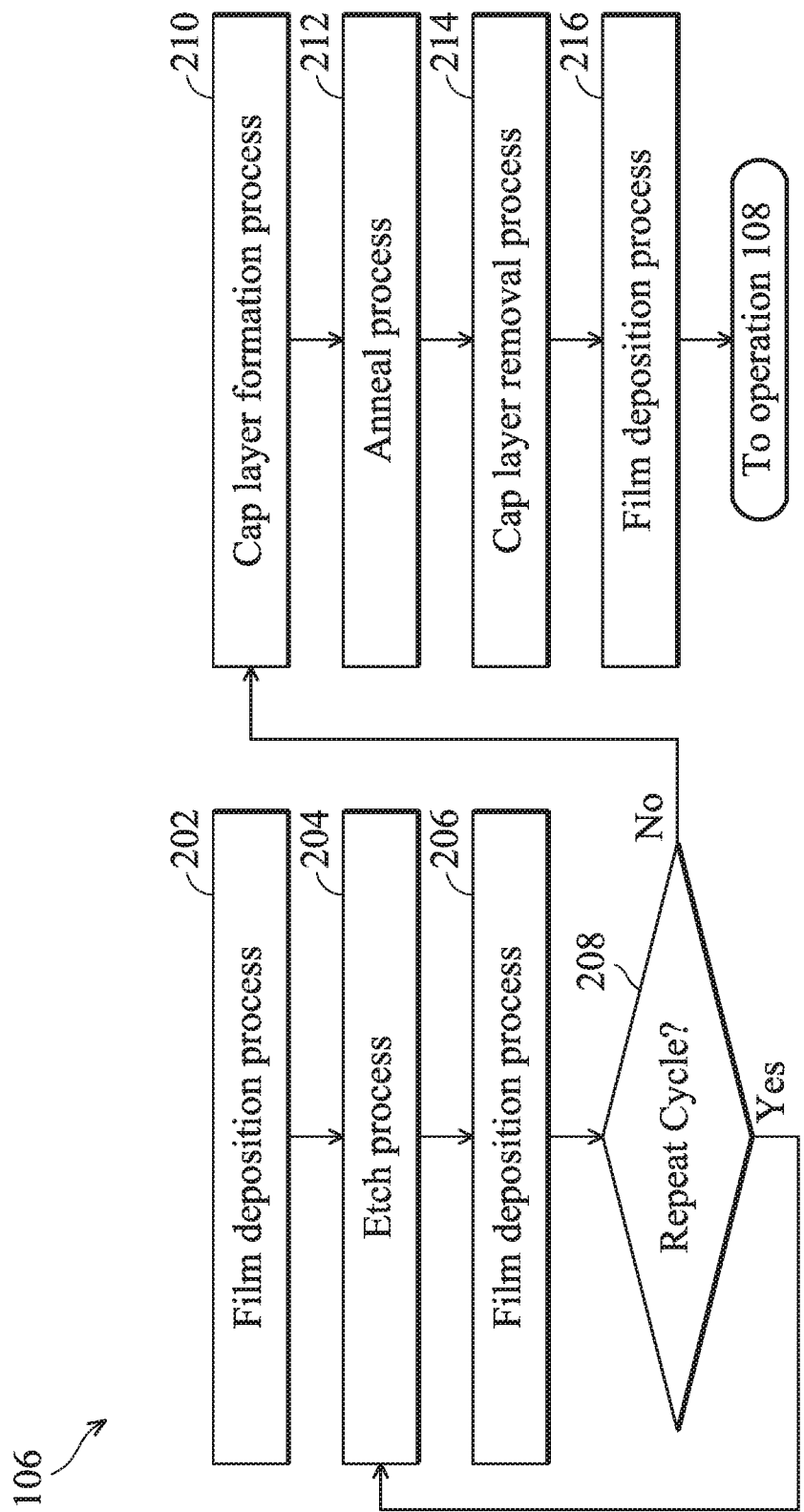
FIG. 2 illustrates an example dummy gate layer formation process according to some embodiments.

FIG. 1 is a flow chart 100 illustrating an exemplary method for fabricating a semiconductor device structure 300 according to some embodiments. FIG. 2 illustrates an example dummy gate layer formation process 106 that can be used during operation of the flow chart 100 of FIG. 1 according to some embodiments. FIGS. 3 through 13B are schematic three-dimensional and cross-sectional views of intermediate structures corresponding to various stages of fabrication of the semiconductor device structure 300 according to the flow chart of FIG. 1 in accordance with some embodiments. It is noted that the flow chart 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

Figure 3:
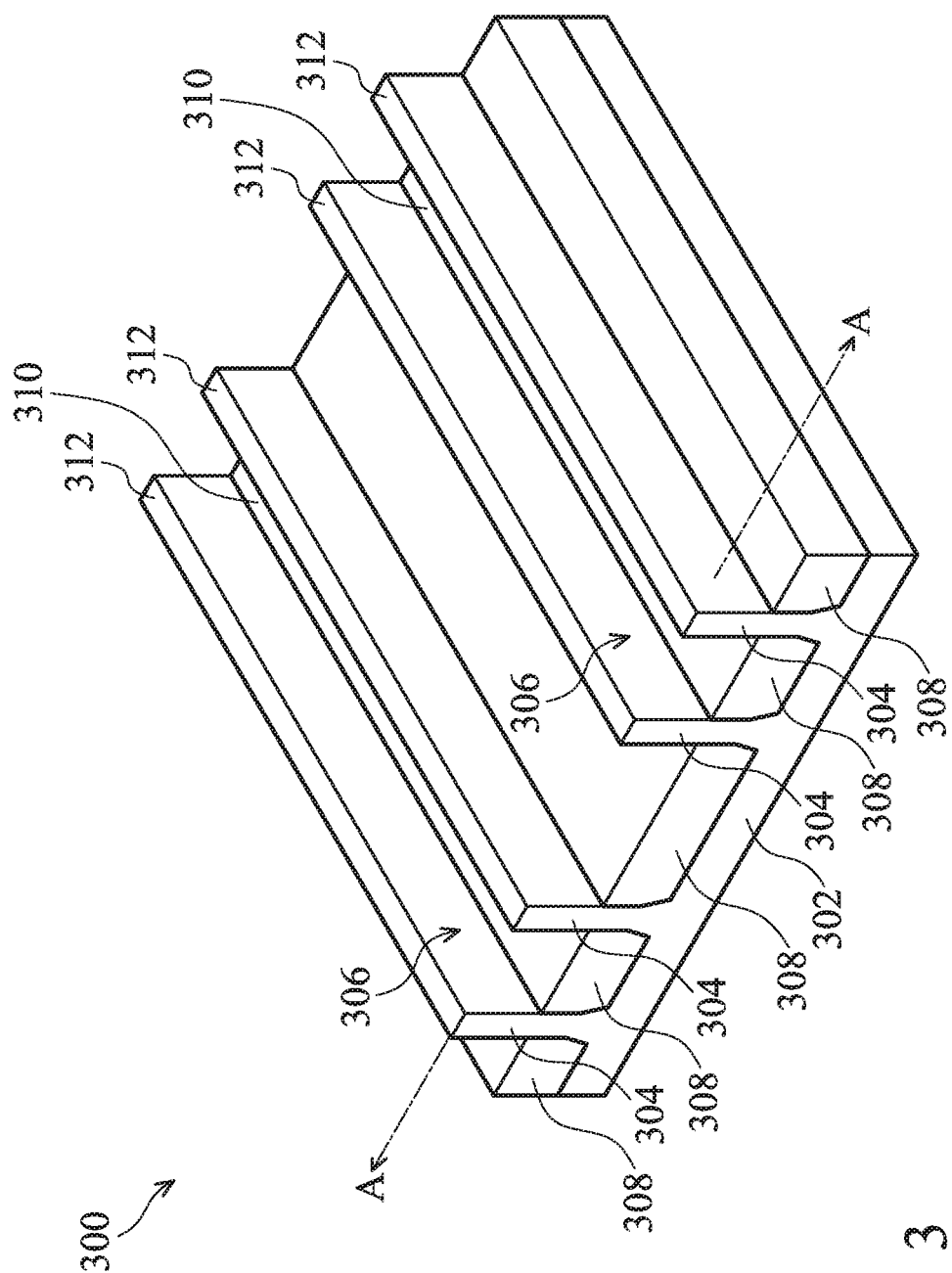

The flow chart 100 begins at operation 102, and further with reference to FIG. 3, by providing a semiconductor substrate 302 having fins 304 formed thereon. The semiconductor substrate 302 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 302 may include an elemental semiconductor including silicon (Si) or germanium (Ge); a compound semiconductor; an alloy semiconductor; or a combination thereof. Each fin 304 provides an active area where one or more devices are to be formed. The fins 304 are fabricated using suitable processes performed on the semiconductor substrate 302 to form trenches 306 in the substrate 302, leaving the fins 304 extended upwardly from the substrate 302. The fins 304 may be patterned by any suitable method. For example, the fins 304 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over the semiconductor substrate 302 and patterned using a photolithography process. Spacers are formed alongside the patterned sacrificial layer using a self-aligned process. The sacrificial layer is then removed, and the remaining spacers may then be used to pattern the fins 304.

The trenches 306 may then be filled with an insulating material. The insulating material may be any suitable dielectric such as an oxide (e.g., silicon oxide), a nitride, the like, or a combination thereof. The insulating material is then recessed, such as by using an acceptable etch process, to form isolation regions 308. The insulating material is recessed such that the top portion of the fins 304 is exposed. The fins 304 protrude above and from between neighboring isolation regions 308.

FIG. 3 further illustrates a cross-section A-A. FIGS. 4 through 9A illustrate cross-sections of the semiconductor device structure 300 corresponding to the cross-section A-A at various stages of fabrication.

Figure 4:
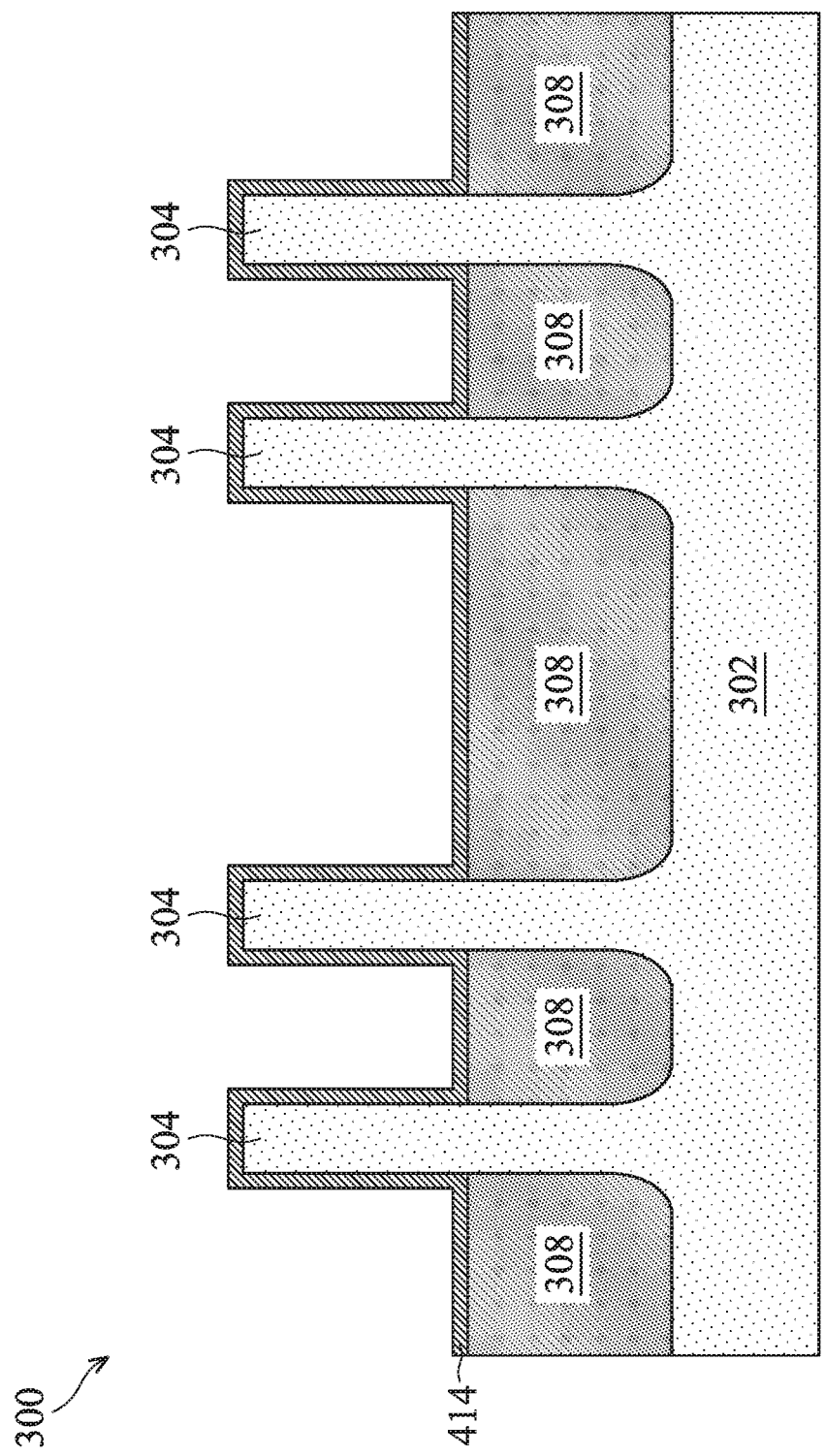

At operation 104, and further with reference to FIG. 4, an interfacial dielectric layer 414 is conformally formed over the substrate 302 to cover the fins 304 and the exposed surfaces of the isolation regions 308. The interfacial dielectric layer 414 may include or be silicon oxide, silicon nitride, the like, or multilayers thereof, and may be thermally and/or chemically grown on the fins 304, or conformally deposited, such as by plasma enhanced chemical vapor deposition (PECVD), atomic layer deposition (ALD), or any suitable deposition technique. In some embodiments, and further at operation 104, a seed layer (not shown) may be conformally formed on the interfacial dielectric layer 414. The seed layer can be formed on the interfacial dielectric layer 414 to help uniform growth of the subsequent dummy gate layer on the fins 304 and the isolation regions 308. The seed layer may be chosen depending on the material of the subsequent dummy gate layer. In some embodiments where the subsequent dummy gate layer includes silicon (e.g., polysilicon or amorphous silicon), the seed layer may be a silicon-containing film. In such a case, the seed layer can be formed by exposing the substrate surface to a silicon-containing compound to form a solid thin film layer containing silicon on the interfacial dielectric layer 414. The term "substrate surface" in this disclosure is intended to include the exposed surface of a film/layer or partial film/layer that has been deposited onto a substrate, such as the substrate 302, and the exposed surface of the newly deposited film/layer can also become the substrate surface prior to any subsequent process(es). The seed layer may be formed by ALD, chemical vapor deposition (CVD), or any suitable deposition technique. In some embodiments, the seed layer is a silicon layer formed by ALD. Suitable silicon-containing compounds may include, but are not limited to, $(SiH_3)_3N$, $Si[N(CH_3)_2]_4$, $SiH[N(CH_3)_2]_3$, $SiH_2[N(CH_3)_2]_2$, $SiH_3[N(CH_3)_2]$, $SiH_3[N((CH—CH_3)_2)_2]$, the like, or combinations thereof. In some embodiments, the seed layer is formed using $SiH_3[N((CH—CH_3)_2)_2]$.

After operation 104, a dummy gate layer is formed over the substrate surface (e.g., over the interfacial dielectric layer 414 and/or the seed layer if used) and fills the trenches 306. Each of the trenches 306 has a bottom surface 310 (e.g., top surface of the isolation region 308) and sidewall surfaces 312 extending upwardly from the bottom surface 310. In various embodiments, the trenches 306 may have an aspect ratio of about 3:1 to about 30:1, such as about 5:1 to about 20:1, for example about 8:1 to about 10:1. The term "aspect ratio" refers to the ratio of the height dimension to the width dimension of a particular feature, for example, trench height/ trench width. The trench height substantially equals to the height of the fins 304 protruding above the isolation regions 308 while the trench width substantially equals to the width or distance of the isolation region 308 between two neighboring fins 304.

The film can be any suitable film, such as a film for forming a dummy gate layer. In some embodiments, the film formed is an amorphous silicon (a-Si) film. For replacement gate processes, the dummy gate layer may be formed of poly-silicon or amorphous silicon.

A dummy gate layer formation process described herein may deposit a film in high aspect ratio trenches without forming (e.g., by reducing or eliminating) a seam or void. Particularly, the dummy gate formation process can be used to fill features with any suitable aspect ratio (ratio of the depth of the feature to the width of the feature), such as a feature with an aspect ratio equal or greater than 5:1, 10:1, 20:1, 25:1, 30:1, 35:1, 40:1, 50:1, or 100:1. As described in more detail herein, various embodiments of the dummy gate layer formation process include a cyclic process for depositing and etching a film in high aspect ratio trenches defined between neighboring fins 304 and annealing the film in order to break Si—H bonds in the film and create dangling bonds. The Si—Si bonds and/or Si—H bonds reform from the dangling bonds, which can reconstruct the film and can reduce or eliminate seams and voids. A cap layer formation process is performed before the annealing process to help prevent hydrogen (H) outgassing during the anneal process, which may help prevent seams from transitioning into voids during the anneal process.

At operation 106, a dummy gate layer formation process is performed to deposit a dummy gate layer over the substrate surface (e.g., exposed surfaces of the interfacial dielectric layer 414 (or the seed layer if used) and fill the trenches 306. FIG. 2 illustrates an example dummy gate layer formation process 106 that can be used during the operation 106 according to some embodiments, and FIGS. 5 to 9A-9B are schematic cross-sectional views of intermediate structures during various stages of fabrication of the semiconductor device structure 300 according to the flow chart of FIG. 2. The dummy gate layer formation process 106 generally includes a film deposition process 202, an etching process 204, a film deposition process 206, a cap layer formation process 210, an anneal process 212, a cap layer removal process 214, and a film deposition process 216. A purge gas such as an inert gas may be flowed into the processing chamber (in which the semiconductor device structure 300 is disposed) between the various deposition, etch, cap layer formation, anneal, and cap layer removal processes 202, 204, 206, 210, 212, 214, 216. For example, the dummy gate layer formation process 106 may include cycles of the film deposition process 202, followed by a chamber purge, followed by the etching process 204, followed by a chamber purge, followed by the film deposition process 206, and followed by a chamber purge. The inert gas may be any suitable inert gas such as argon, helium, neon, or any combination thereof.

The film deposition processes 202, 206, 216 and the etching process 204 may be performed in the same or different processing chamber. The deposition-etch processes 204, 206 can be repeated sequentially and/or alternatingly to gradually fill the trenches 306. After a pre-determined number of cycles of the deposition-etch processes 204, 206, the film formed can fill the trenches, such as the trenches 306 from bottom surface 310 to tops of the fins 304. This cyclic deposition-etch processes 204, 206 can be repeated until trench fill is achieved, as determined at operation 208, or a desired height of the dummy gate layer is achieved. Thereafter, the dummy gate layer formation process 106 may proceed to the cap layer formation process 210, anneal process 212, cap layer removal process 214, and another film deposition process 216, and then to operation 108.

Figure 5:
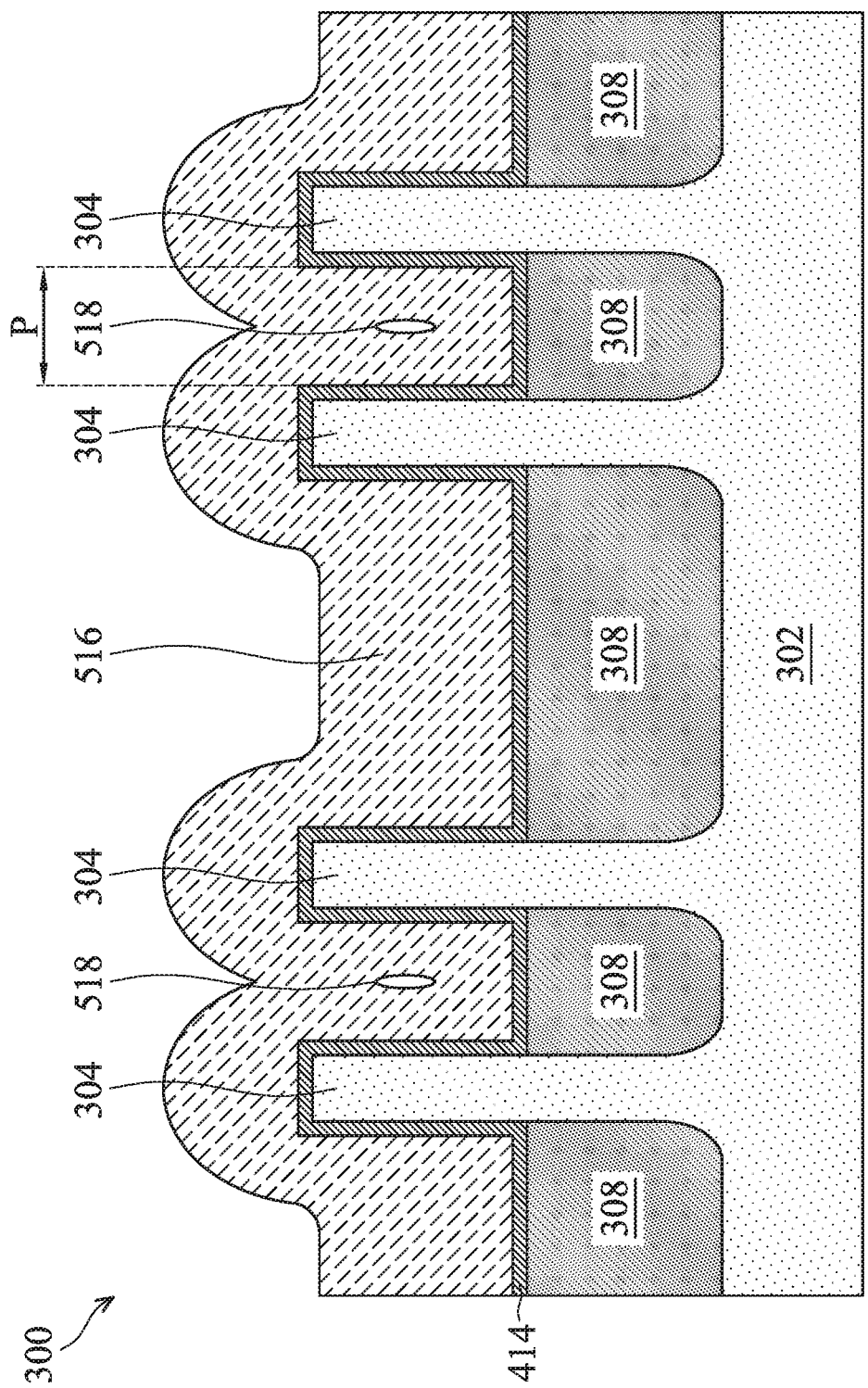

The film deposition process 202 includes depositing at least a portion of a film 516 over the substrate surface, as shown in FIG. 5. In some embodiments, the substrate surface may include exposed surfaces of the interfacial dielectric layer 414 that is conformally formed on fins 304 and the upper surfaces of the isolation regions 308. In some embodiments, the substrate surface may include an exposed surface of the seed layer (if present) that is conformally formed on the interfacial dielectric layer 414. In various embodiments, the film 516 formed by the film deposition process 202 may include or be any material suitable for a dummy gate layer. Suitable material for the film 516 may include amorphous silicon (a-Si) or polysilicon. In an example, the film 516 formed by the film deposition process 202 is amorphous silicon. The film deposition process 202 can be any suitable deposition process including, but is not limited to, low-pressure CVD (LPCVD), CVD, PECVD, ALD, plasma-enhanced ALD (PEALD), or any suitable deposition technique. In some embodiments, the film deposition process 202 is performed using LPCVD. LPCVD may be advantageous in some applications since it can deposit a wide range of film compositions with good conformal step coverage.

The film 516 may be formed by exposing the substrate surface to a silicon-containing precursor. Suitable silicon-containing precursors may include silanes, halogenated silanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include, but are not limited to, a chlorinated silane, such as monochlorosilane ($SiH_3Cl$, MCS), dichlorosilane ($SiH_2Cl_2$, DCS), trichlorosilane ($SiHCl_3$, TCS), hexachlorodisilane ($Si_2Cl_6$, HCDS), octachlorotrisilane ($Si_3Cl_8$, OCTS), or silicon tetrachloride (STC). In some embodiments, the silicon-containing precursor may use organosilanes which may include compounds with the empirical formula $R_ySi_xH_{(2x+2-y)}$, where R is independently methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$), tris(dimethylamino)silane (TDMAS), and any combination thereof. In some cases, the silicon-containing precursor may be carbon-free.

In examples implementing LPCVD, the reactor of the LPCVD can be heated and maintained by heating elements of the LPCVD reactor at a temperature in a range from about 300° C. to about 800° C. A silicon-containing precursor, such as $SiH_4$, $Si_2H_6$, $SiH_2Cl_2$, $SiHCl_3$, $Si_2Cl_6$, or any combination thereof, may be introduced into the LPCVD reactor from a gas injector. In some examples, the silicon-containing precursor includes $SiH_4$ and $Si_2H_6$. In some examples, the silicon-containing precursor is flowed at a rate less than or equal to about 5 standard liters per minute (sLm). The pressure inside the reactor can be maintained at pressure less than or equal to about 5 Torr. The film deposition process 202 forms the film, e.g., a-Si, over the substrate surface with a thickness in a range from about 10 Angstroms to about 100 Angstroms.

While the dummy gate layer material using silicon is discussed, the concept described herein is equally applicable to other materials such as silicon germanium ($Si_xGe_{1-x}$, where x can be between approximately 0 and 1), silicon carbide, silicon phosphorus, silicon carbon phosphorus, germanium, a III-V compound semiconductor, a II-VI compound semiconductor, or the like. In cases where silicon germanium is implemented, a germanium-containing precursor (e.g., $GeH_4$, $Ge_2H_6$, etc.) or a halogenated germanium precursor (e.g., $GeCl_4$, $GeHCl_3$, $Ge_2Cl_6$, $Ge_3Cl_6$, etc.) may be used in conjunction with any of the silicon-containing precursors discussed above to fill the trenches, such as the trenches 306.

After the film deposition process 202, the dummy gate layer formation process 106 continues to the etching process 204. The etching process 204 can be performed in situ in the reactor of the LPCVD. A purge can be performed following the film deposition process 202 and before the etching process 204. During the etching process 204, the reactor of the LPCVD can be maintained at a temperature in a range from about 300° C. to about 800° C. An etchant gas (e.g. a halogen-containing precursor), such as $Cl_2$, HCl, $F_2$, or any combination thereof, may be introduced into the LPCVD reactor from a gas injector. In some examples, the etchant gas includes $Cl_2$. In some examples, the etchant gas is flowed at a rate in a range from about 100 sccm to about 10000 sccm. The pressure inside the reactor can be maintained at pressure less than or equal to about 5 Torr. The etching process 204 may remove portions of the deposited film 516 at upper portions of trenches, such as high aspect ratio trenches. By removing these portions of the deposited film 516, the film 516 may be prevented from being pinched-off or closed at the upper portions of the trenches before the respective trench is filled.

After the etching process 204, the dummy gate layer formation process 106 proceeds to the film deposition process 206. The film deposition process 206 can be performed in situ in the reactor of the LPCVD. A purge can be performed following the etching process 204 and before the film deposition process 206. The film deposition process 206 can be identical to the film deposition process 202 as discussed above.

In some embodiments, the etching process 204 and film deposition process 206 may be repeated any number of cycles. After the film deposition process 206, the dummy gate layer formation process 106 proceeds to operation 208 to determine whether another cycle should be repeated. If another cycle is to be repeated, the dummy gate layer formation process 106 proceeds to perform the etching process 204 and the film deposition process 206 as discussed above. If another cycle is not to be repeated, the dummy gate layer formation process 106 proceeds to the cap layer formation process 210.

In some examples, cycles can be repeated until at least some of the trenches 306 (e.g., high aspect ratio trenches) between fins 304 are filled with the film 516. For example, the cycles can be repeated until the thickness of the film 516 exceeds half a pitch between neighboring fins 304, e.g., that define a high aspect ratio trench. Hence, the film 516 can have lateral growth fronts in a trench (e.g., proceeding laterally from sidewalls of respective fins 304) that merge together. The merging of the lateral growth fronts can create seams and/or voids 518 in the film 516 between neighboring fins 304, as shown in FIG. 5. Some embodiments can have different pitches between fins 304, and the thickness of the film 516 may correspond to any of the pitches.

In some examples, the formation of the film 516 by processes 202, 204, 206 may result in deformation of one or more of the fins 304. The film 516 can be formed by processes 202, 204, 206 with a high stress, which can cause, e.g., bending of the fins 304.

Figure 6:
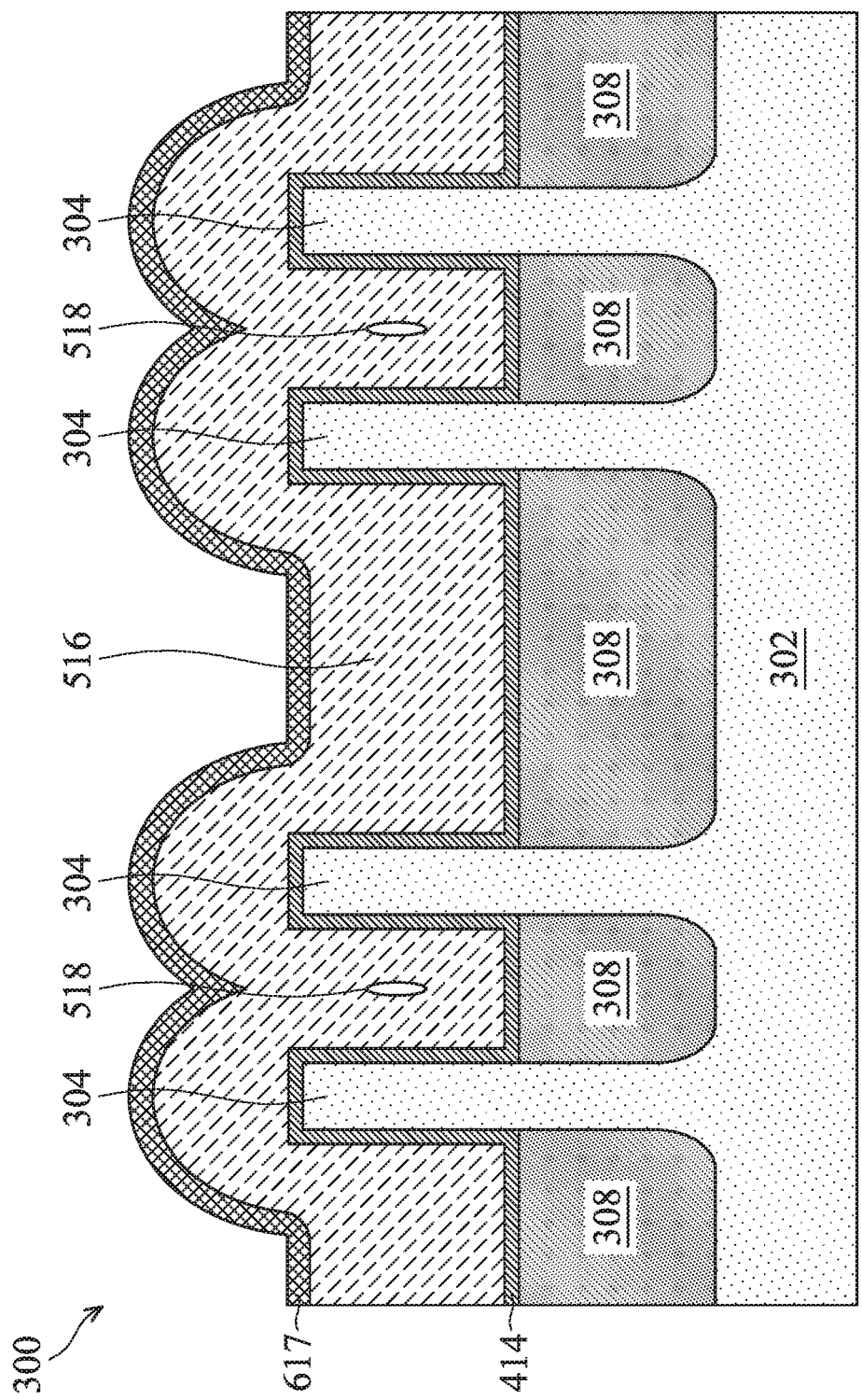

In some embodiments, after at least some of the trenches are filled and another cycle is not to be repeated at operation 208, the cap layer formation process 210 and anneal process 212 are performed. The cap layer formation process 210 may forms the cap layer 617 on film 516, as shown in FIG. 6. Due to the presence of hydrogen in the precursor used during the film deposition processes 202, 206, the film 516 may include hydrogen. For example, the film 516 may have a hydrogen concentration of about 0 to about 1%. The cap layer 617 may prevent at least some of the hydrogen in the film 516 from escaping (e.g., outgassing from the film 516) during the subsequent anneal process 212, thereby reducing or avoiding the likelihood of the formation of additional voids or the likelihood of seams becoming voids during the anneal process 212.

In some examples, the cap layer formation process 210 may be performed in a same or different chamber than the film deposition processes 202, 206, and/or the etching process 204. In some examples, the cap layer formation process 210 forms the cap layer 617 conformally over the film 516. In some examples, the cap layer 617 is a dielectric material, such as silicon oxide, silicon nitride, or the like. In some examples, the cap layer 617 is an oxide. In some examples, the cap layer formation process 210 forms the cap layer 617 by an oxidation process. In some examples, the cap layer 617 is formed by exposing the film 516 to a natural ambient, which may include oxygen or oxygen-containing gases, to form a native oxide as the cap layer 617. In some examples, the cap layer 617 is formed by an oxidation process, which can include flowing an oxygen-containing gas, such as oxygen ($O_2$), ozone ($O_3$), steam, or the like, in a chamber in which the substrate is disposed. In some examples, the cap layer 617 is formed by in situ steam generation (ISSG) oxidation. In some examples, after forming the film 516, the substrate is removed from the chamber to expose the film 516 to the natural ambient. In some examples, the cap layer 617 is thermally and/or chemically grown on the film 516, or conformally deposited, such as by PECVD, ALD, or any suitable deposition technique. Other processes and/or conditions may be implemented for the cap layer formation process 210.

In some examples, a thickness of the cap layer 617 can be controlled to achieve a target reduction or prevention of H outgassing during the subsequent anneal process 212, which may further include consideration of a pressure used during the subsequent anneal process 212. In some examples, for a given target reduction or prevention of H outgassing during the subsequent anneal process 212, if a higher pressure is used during the anneal process 212, the cap layer 617 can be formed with a lesser thickness, and if a lower pressure is used during the anneal process 212, the cap layer 617 can be formed with a greater thickness. In some examples, the thickness of the cap layer 617 is in a range from about 10 angstroms to about 1000 angstroms.

After forming the cap layer 617, the dummy gate layer formation process 106 proceeds to the anneal process 212. The anneal process 212 is thermal annealing process. In some examples, the anneal process 212 is a Rapid Thermal Anneal (RTA), Sub-Second Anneal (SSA), or laser anneal (melting or sub-melting or non-melting). In some examples, the anneal process 212 is a low-temperature, high-pressure anneal. In some examples, the anneal process 212 is performed for a duration in a range from about 15 seconds to about 300 min. In some examples, the anneal process is performed at an ambient temperature in a range from about 300° C. to about 800° C. In some examples, the duration and temperature of the anneal process 212 may be selected or controlled in order to reduce or avoid crystallization of the film 516 (e.g., an a-Si film) during the anneal process 212. For example, for a higher temperature anneal, the duration of the anneal process 212 may be shorter, and for a lower temperature anneal, the duration of the anneal process 212 may be longer. In some examples, the anneal process 212 is performed in an ambient gas, such as nitrogen ($N_2$), hydrogen ($H_2$), or a combination thereof. In some examples, the ambient gas is nitrogen. In some examples, the anneal process 212 is performed in an ambient pressure that is equal to or greater than about 1 Torr, such as in a range from about 1 Torr to about 90 Torr. As discussed above, the ambient pressure may be selected or controlled along with the thickness of the cap layer 617 to achieve a reduction or prevention of H outgassing. For example, the film 516 may initially include a first amount of hydrogen (e.g., around 1%) and after the anneal process 212, a second amount of hydrogen is present in the film 516. Because of the cap layer 617 and low temperature anneal process 212, the hydrogen outgassing is reduced or eliminated. Thus, after the anneal process 212, the second amount of hydrogen present in the film 516 may be similar to the first amount of hydrogen present in the film 516 before the anneal, for example, the second amount of hydrogen after the anneal process 212 may be in a range from 70% to 95% the first amount of hydrogen present in the film 516 before the anneal. Other processes and/or conditions may be implemented for the anneal process 212.

Figure 7:
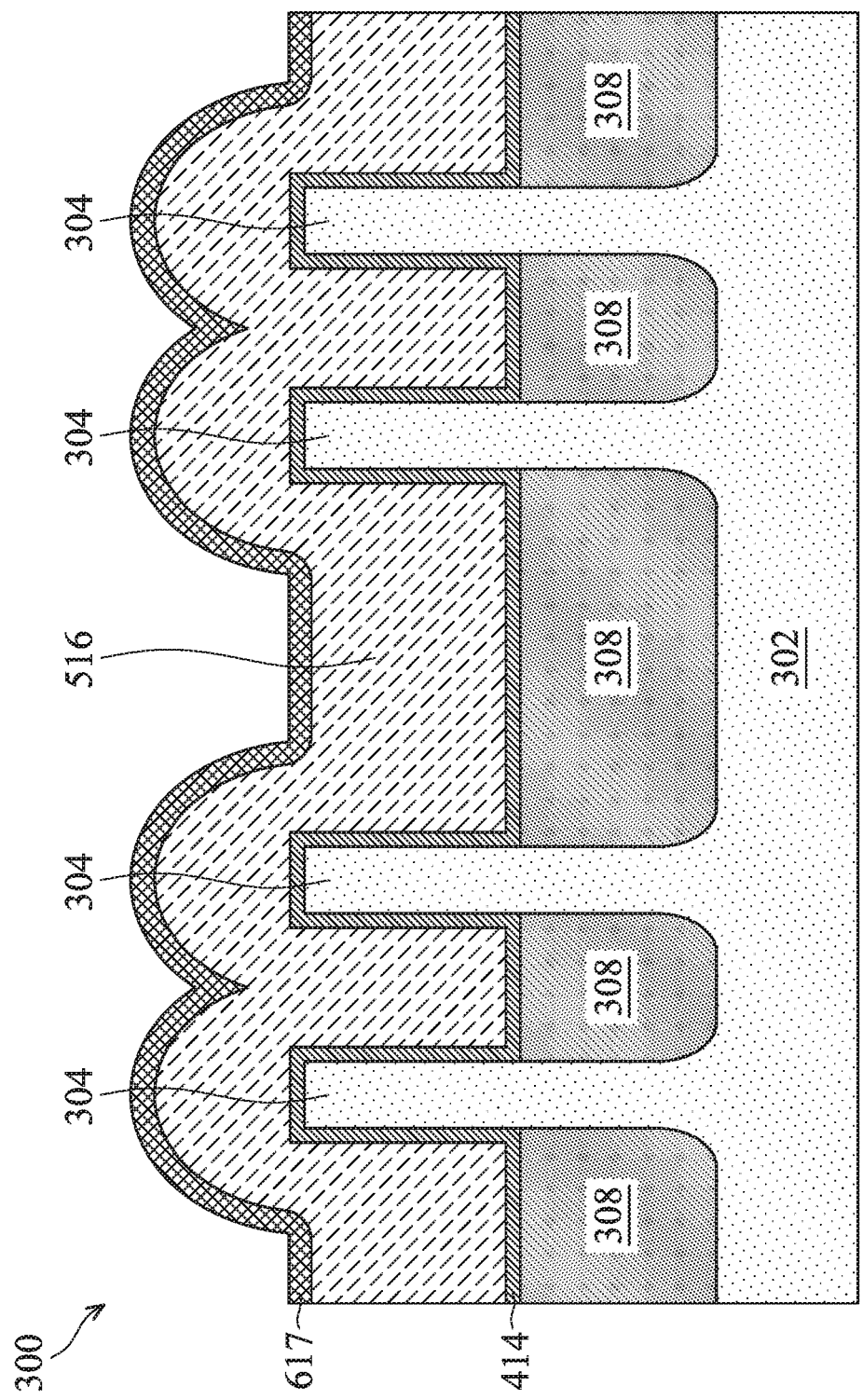

The anneal process 212 may result in reducing or eliminating the seams and/or voids 518, as shown in FIG. 7. The anneal process 212 may also result in reducing or eliminating bending of the fins 304. Generally, the anneal process 212 may break Si—H bonds in the film 516 during anneal process 212. The breaking of the Si—H bonds may result in dangling Si bonds in the film 516 and in the release of stress from the film 516. The release of stress from the film 516 can reduce or eliminate bending of the fins 304. The dangling Si bonds may then be restructured in the film 516 as Si—Si and/or Si—H bonds, which can cause the film 516 to reconstruct and can eliminate or reduce the seams and/or voids 518. The presence of the cap layer 617 during the anneal process 212 and/or the high pressure used during the anneal process 212 may prevent the H outgassing and formation of additional voids and/or may prevent the seams from becoming voids. The low temperature and/or the duration of the anneal process 212 may reduce or avoid crystallization of amorphous silicon to polycrystalline silicon (e.g., polysilicon) during the anneal process 212 which may aid in forming smooth sidewalls from subsequent patterning of the film 516, as described in more detail below with respect to FIGS. 10A, 10B, and 10C.

Figure 8:
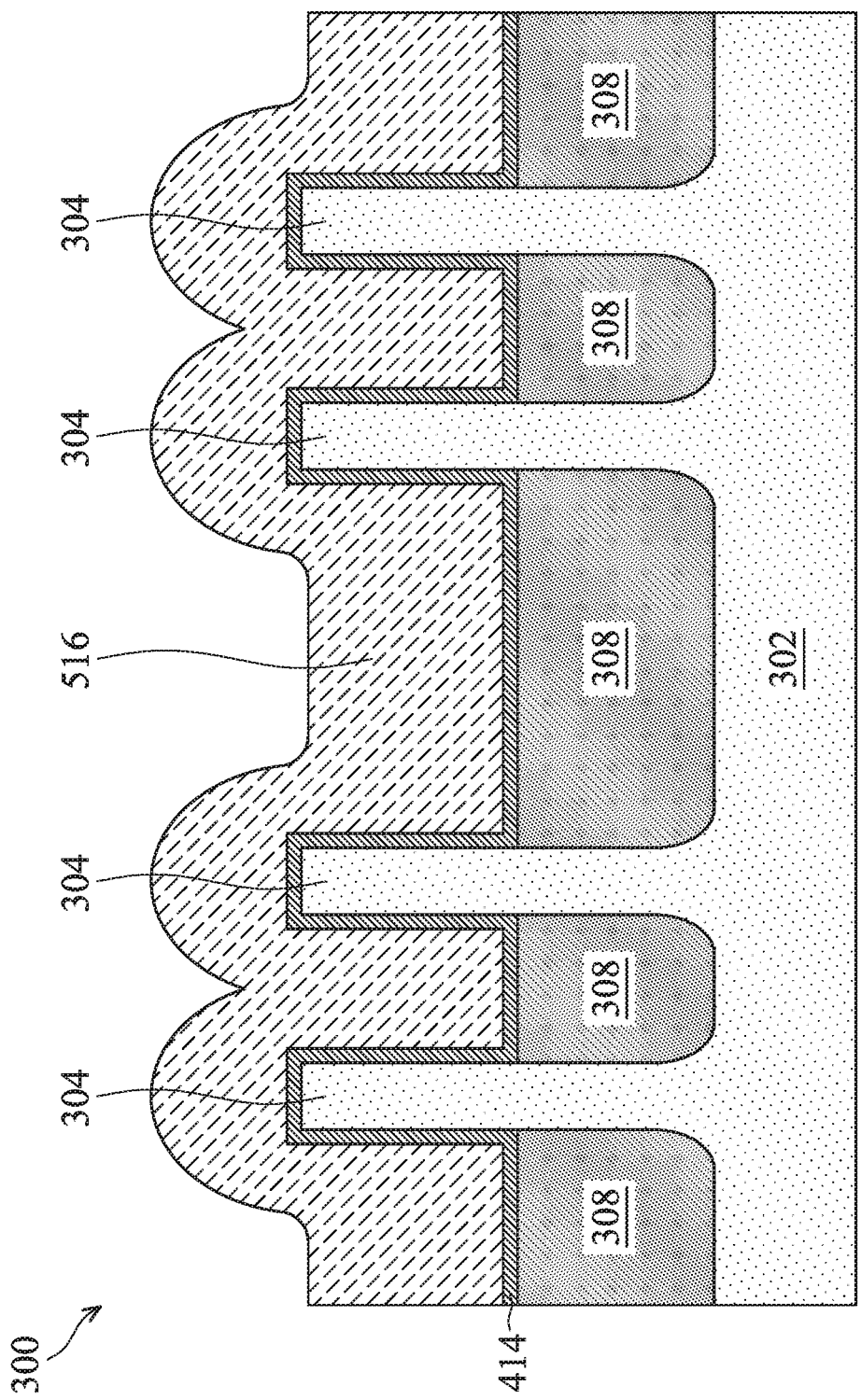

After the anneal process 212, the dummy gate layer formation process 106 proceeds to the cap layer removal process 214. The cap layer removal process 214 may include a wet etch process and/or dry etch process to remove the cap layer 617 from the film 516 after performing the anneal process 212, as shown in FIG. 8. An example wet etch process may be use a solution including diluted hydrofluoric acid (dHF), ammonium fluoride ($NH_4F$), a mixture of dHF/$NH_4F$, or other appropriate wet etchant. In some examples, the wet etch process can be performed by immersing and/or rinsing the device structure 300 in the solution. The wet etch process may be performed at a temperature in a range from about 20° C. to about 100° C. The wet etch process may be performed for a duration in a range from about 15 seconds to about 3600 seconds. Other processes and/or conditions may be implemented for the cap layer removal process 214.

After the cap layer removal process 214, the dummy gate layer formation process 106 proceeds to a film deposition process 216. The film deposition process 216 can be performed in the reactor of the LPCVD. The film deposition process 216 can be identical to the film deposition processes 202, 206, as discussed above, or can be any other deposition process. The film deposition process 216 continues the deposition of the film 516 until the film 516 obtains a desired thickness. For example, the film deposition process 216 can continue until a lowest point of the upper surface of the film 516 is some thickness above a level of top surfaces of the fins 304, which thickness may be, for example, in a range from about 100 nm to about 300 nm.

Figure 9A:
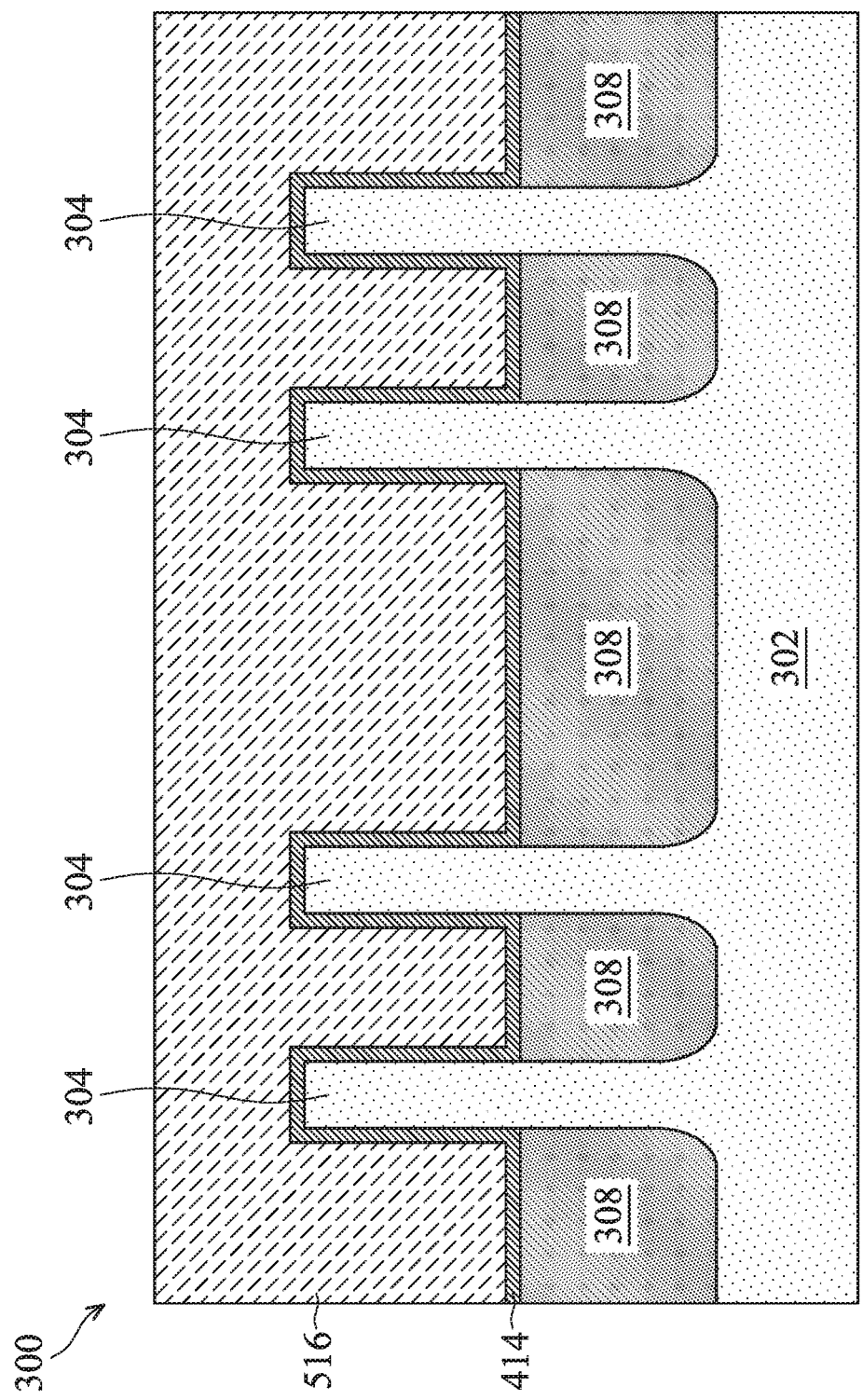

FIG. 9A illustrates the film 516 after the film deposition process 216 and subsequent planarization of the film 516. As shown, trenches 306 between neighboring fins 304 have been filled with substantially no seam or void (e.g., no seam and/or void has a dimension greater than 1 nm in the trenches 306) after a suitable number of cycles of the deposition-etch processes 204, 206, the cap layer formation process 210, anneal process 212, cap layer removal process 214, and film deposition process 216. In some examples, such as illustrated, the film 516 is planarized, such as by a chemical mechanical planarization (CMP), to form a top surface of the film 516 to be planar.

Figure 9B:
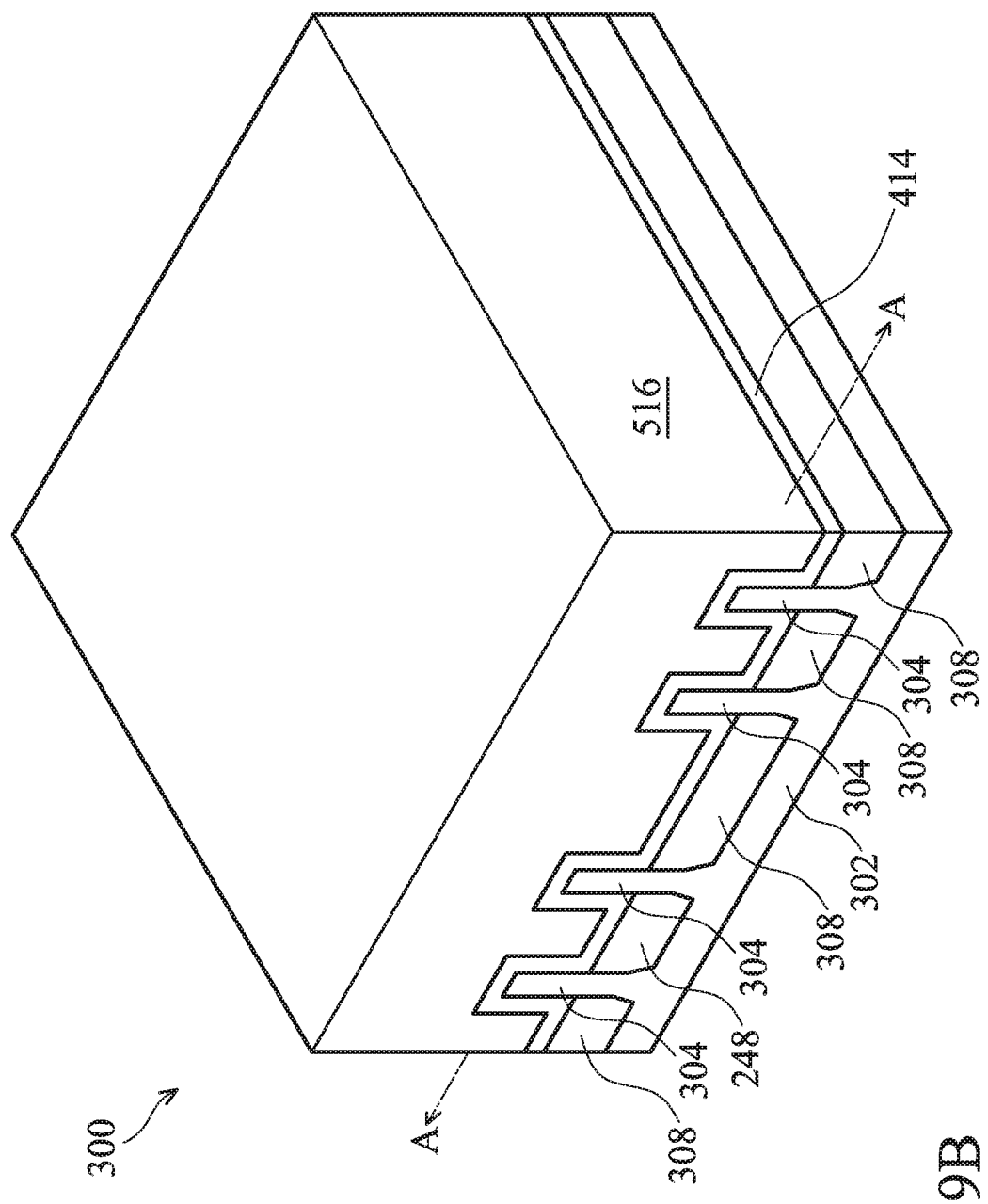

FIG. 9B illustrates a three-dimensional view of the semiconductor device structure 300 of FIG. 9A where the dummy gate layer (e.g., the film 516) has been formed over the substrate surface according to some embodiments. After the dummy gate layer 516 is formed and the trenches are filled, the flow chart 100 may proceed to operation 108, as will be discussed below in more detail.

Figure 10C:
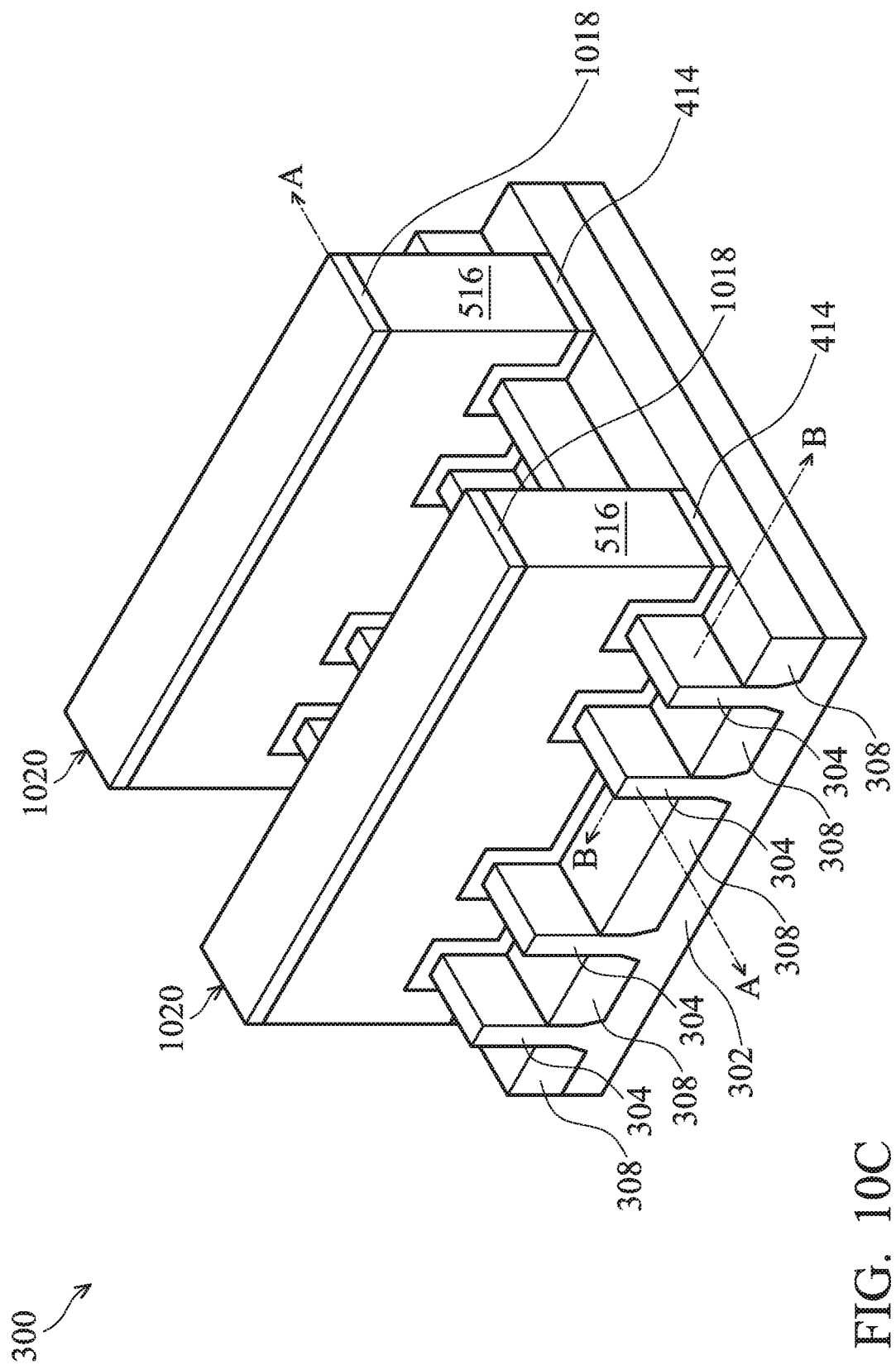

At operation 108, and with reference to FIGS. 10A, 10B, and 10C, a mask 1018 is formed over the dummy gate layer 516, and the mask 1018, dummy gate layer 516, and interfacial dielectric layer 414 (and seed layer, if used) may then be patterned, for example, using photolithography and one or more etch processes to form the mask 1018, dummy gate layer 516, and interfacial dielectric layer 414 for each dummy gate structure 1020, as shown in FIGS. 10A and 10C. The mask 1018 may include or be silicon nitride, silicon oxynitride, silicon carbon nitride, the like, or a combination thereof, deposited by CVD, physical vapor deposition (PVD), ALD, or any suitable deposition technique. Particularly, the dummy gate structures 1020 are over and extend perpendicularly to the fins 304.

FIG. 10C further illustrates reference cross-sections. Cross-section A-A of FIG. 10C is in a plane along, e.g., channels in one fin 304 between opposing source/drain regions 1122. Cross-section B-B of FIG. 10C is in a plane perpendicular to cross-section A-A and is across source/drain regions 1122 in two neighboring fins 304. Cross-section B-B of FIG. 10C corresponds to a portion of the cross-section A-A of FIG. 3; a person having ordinary skill in the art will readily understand how processing of the cross-section B-B of FIG. 10C can be extrapolated to the cross-section A-A of FIG. 3. FIG. 10A and following figures ending with an "A" designation illustrate cross-sectional views at various instances of processing corresponding to cross-section A-A of FIG. 10C, and FIG. 10B and following figures ending with a "B" designation illustrate cross-section views at various instances of processing corresponding to cross-section B-B of FIG. 10C.

Figure 11A:
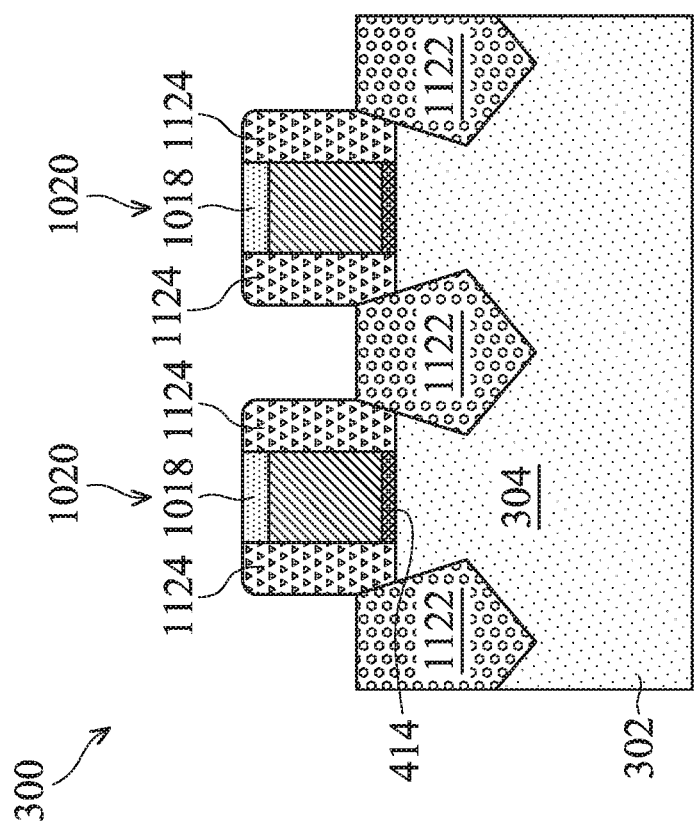
Figure 11B:
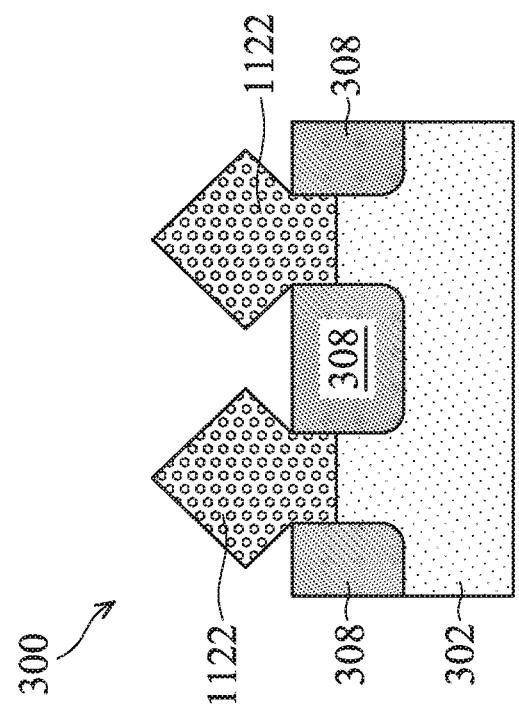

At operation no, and with reference to FIGS. 11A and 11B, gate spacers 1124 are formed along sidewalls of the dummy gate structures 1020 (e.g., sidewalls of the interfacial dielectric layer 414, dummy gate layer 516, and mask 1018) and over the fins 304. The gate spacers 1124 may be formed by conformally depositing one or more layers for the gate spacers 1124 and anisotropically etching the one or more layers, for example. The one or more layers for the gate spacers 1124 may include a material different from the material(s) for the dummy gate structure 1020. In some embodiments, the gate spacer 1124 may include or be a dielectric material, such as silicon oxygen carbide, silicon nitride, silicon oxynitride, silicon carbon nitride, the like, multi-layers thereof, or a combination thereof, and may be deposited by any suitable deposition technique. An anisotropic etching process is then performed to remove portions of the layers to form the gate spacers 1124, as depicted in FIGS. 11A and 11B.

If seams and/or voids 518 are not reduced or eliminated from the film 516 as described above, the patterning of the dummy gate layer 516 in operation 108, and illustrated in FIGS. 10A and 10C, could expose the seam and/or void 518 at a sidewall of the dummy gate structure 1020. With the seam and/or void 518 exposed at the sidewall of the dummy gate structure 1020, the one or more layers for the gate spacers 1124 could be deposited in the seam and/or void 518, and therefore, the gate spacers 1124 could be formed with a portion injected into the seam and/or void 518. This injected portion could cause defects in the removal of the dummy gate structure 1020 and/or in the formation of the replacement gate structure 1230, as described subsequently. However, in some examples, the risk of a seam and/or void 518 being in the dummy gate layer 516 at the patterning of the dummy gate layer 516 can be reduced (e.g., by performing the cap layer formation process 210 and anneal process 212), which can reduce the risk of an injected portion of a gate spacer 1124 being formed in the dummy gate layer 516.

In some examples, the dummy gate layer 516 is amorphous silicon and the low temperature anneal process 212 reduces or minimizes the crystallization of the a-Si to polysilicon during the anneal process 212. The deposition of the one or more layers for the gate spacers 1124 and/or the anisotropic etching process can be performed at temperatures that cause the amorphous silicon to crystallize into polycrystalline silicon. Hence, in subsequent processing, the dummy gate layer 516 may be polysilicon. With the dummy gate layer 516 being amorphous silicon at the initiation of the deposition of the one or more layers for the gate spacers 1124, smooth sidewalls for the gate spacers (and subsequently formed replacement gate structure 1230) may be achieved.

After the gate spacers 1124 are formed, source/drain regions 1122 may be formed in the fins 304, as depicted in FIGS. 11A and 11B. In some examples, recesses can be etched in the fins 304 using the dummy gate structures 1020 and gate spacers 1124 as masks (such that recesses are formed on opposing sides of the dummy gate structures 1020), and a material may be epitaxially grown in the recesses to form the source/drain regions 1122. Additionally or alternatively, the source/drain regions 1122 may be formed by implanting dopants into the fins 304 and/or the epitaxial source/drain regions 1122 using the dummy gate structures 1020 as masks (such that the source/drain regions 1122 are formed on opposing sides of the dummy gate structures 1020).

Depending on the conductivity type of the transistor, the material for the source/drain regions 1122 may be chosen to include or be silicon germanium, silicon carbide, silicon phosphorus, silicon carbon phosphorus, germanium, a III-V compound semiconductor, a II-VI compound semiconductor, or the like. The source/drain regions 1122 may be raised with respect to the fins 304 and may have facets, which may correspond to crystalline planes of the semiconductor substrate 302.

Figures 12A, 12B:
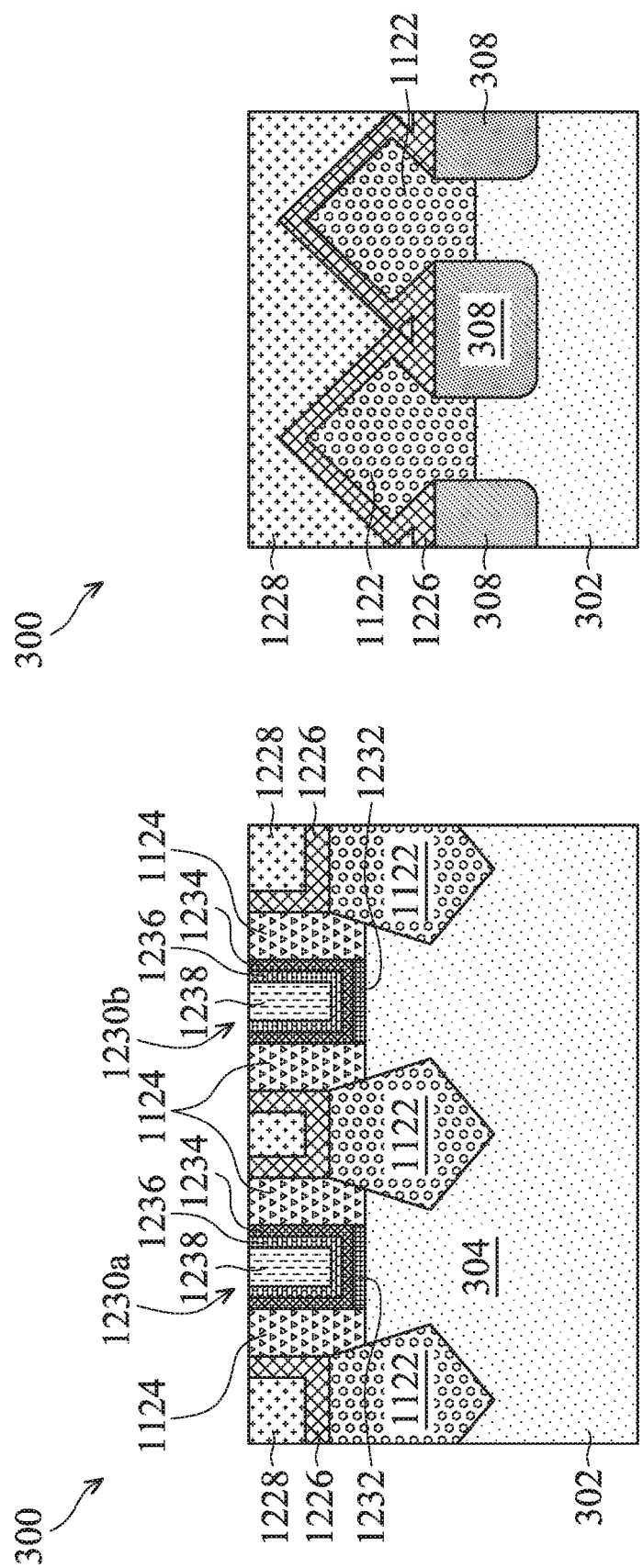

With reference to FIGS. 12A and 12B, an contact etch stop layer (CESL) 1226 and a first interlayer dielectric (ILD) 1228 are sequentially formed on surfaces of the source/drain regions 1122, sidewalls and top surfaces of the gate spacers 1124, top surfaces of the masks 1018, and top surfaces of the isolation regions 308 using any suitable deposition technique. The CESL 1226 is deposited conformally and may include or be silicon nitride, silicon carbon nitride, silicon carbon oxide, carbon nitride, the like, or a combination thereof. The first ILD 1228 may include or be tetraethylorthosilicate (TEOS) oxide, silicon dioxide, a low-k dielectric material (e.g., a material having a dielectric constant lower than silicon dioxide), or another material. A CMP process may then be performed to planarize the first ILD 1228 and the CESL 1226 and to remove the masks 1018 of the dummy gate structures 1020, thereby leveling the top surface of the first ILD 1228 and CESL 1226 with the top surfaces of the dummy gate layers 516.

At operation 112, and with reference to FIGS. 12A and 12B, the dummy gate structures 1020 are removed and replacement gate structures 1230a, 1230b are formed where the dummy gate structures 1020 were removed. The dummy gate structures 1020 can be removed using one or more etch processes. Upon removal of the dummy gate structures 1020, recesses are formed between the gate spacers 1124 where the dummy gate structures 1020 are removed, and channel regions of the fins 304 are exposed through the recesses.

As described previously, an injected portion of a gate spacer 1124 could be formed if a seam and/or void 518 is exposed in the dummy gate structure 1020 during the formation of the gate spacer 1124. The injected portion could act as an etch stop and prevent removal of some of the dummy gate structure (e.g., such as underlying the injected portion). This could cause a defect in the subsequently formed replacement gate structure. In some examples, as described above, the risk of an injected portion of a gate spacer 1124 in a dummy gate structure 1020 can be reduced, which can reduce the risk of such an injected portion acting as an etch stop and causing a defect. Hence, yield in the manufactured device can be increased.

The replacement gate structures 1230a, 1230b are then formed in the recesses where the dummy gate structures 1020 were removed. The replacement gate structures 1230a, 1230b each may include, as illustrated in FIG. 12A, an interfacial dielectric 1232, a gate dielectric layer 1234, one or more optional conformal layers 1236, and a gate conductive fill material 1238. The interfacial dielectric 1232 is formed on top surfaces of the fins 304 along the channel regions. The interfacial dielectric 1232 can be an oxide (e.g., silicon oxide) formed by thermal or chemical oxidation of the fin 304, and/or a nitride (e.g., silicon nitride), and/or another dielectric layer using any suitable deposition technique.

The gate dielectric layer 1234 can be conformally deposited in the recesses where dummy gate structures 1020 were removed (e.g., on the interfacial dielectric 1232, and sidewalls of the gate spacers 1124) and on the top surfaces of the first ILD 1228, the CESL 1226, and gate spacers 1124. The gate dielectric layer 1234 can be or include silicon oxide, silicon nitride, a high-k dielectric material, multilayers thereof, or other dielectric material. A high-k dielectric material may have a k value greater than about 4.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 1236 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A layer for the gate conductive fill material 1238 is formed over the one or more optional conformal layers 1026, if implemented, and/or the gate dielectric layer 1234. The layer for the gate conductive fill material 1238 can fill remaining recesses where the dummy gate structures 1020 were removed. The layer for the gate conductive fill material 1238 may be or include a metal-containing material such as tungsten, cobalt, aluminum, ruthenium, copper, multi-layers thereof, a combination thereof, or the like.

A planarization process, like a CMP, may remove portions of the layer for the gate conductive fill material 1238, one or more optional conformal layers 1236, and gate dielectric layer 1234 above the top surfaces of the first ILD 1228, the CESL 1226, and gate spacers 1124. The replacement gate structures 1230 including the gate conductive fill material 1238, one or more optional conformal layers 1236, gate dielectric layer 1234, and interfacial dielectric 1232 may therefore be formed as illustrated in FIG. 12A.

Figures 13A, 13B:
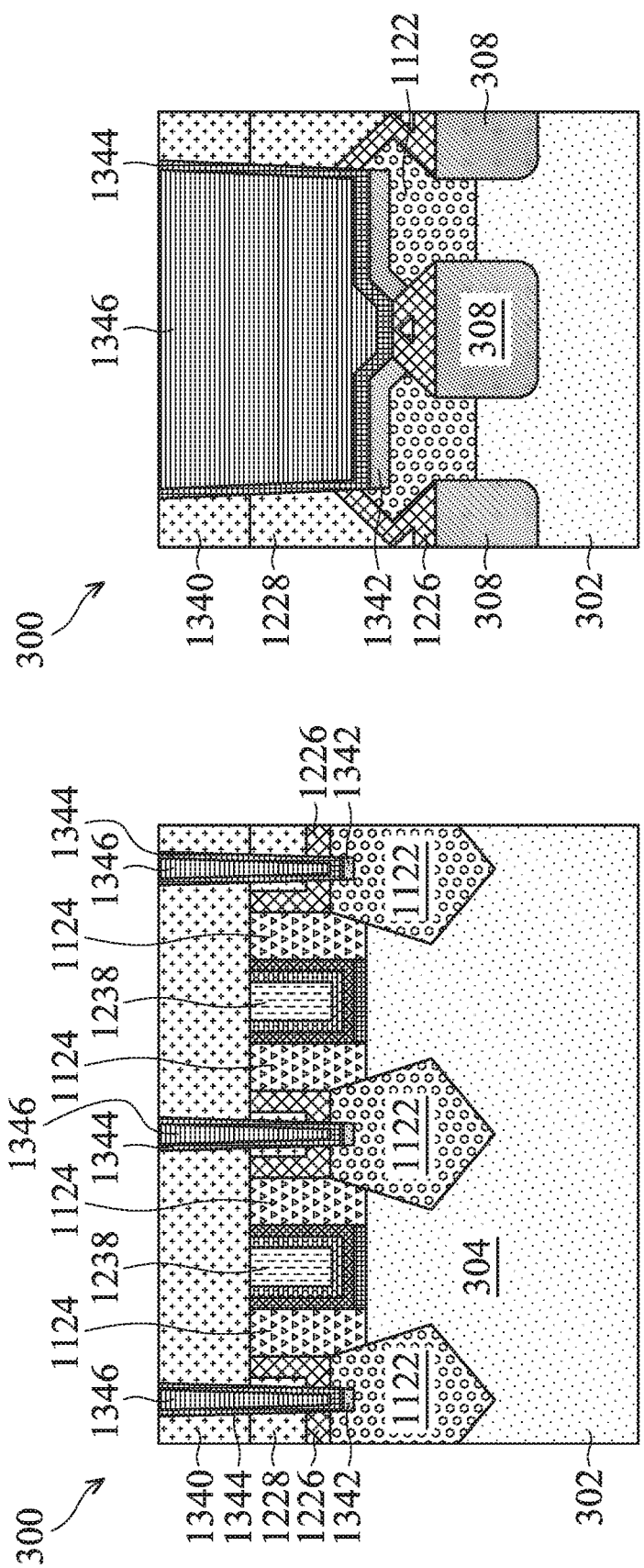

A second ILD 1340 is formed over the gate conductive fill material 1238, one or more optional conformal layers 1236, and gate dielectric layer 1234, first ILD 1228, gate spacers 1124, and CESL 1226, as shown in FIGS. 13A and 13B. The second ILD 1340 may include or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

After the second ILD 1340 is formed, source/drain contact openings are formed through the second ILD 1340, the first ILD 1228, and the CESL 1226 to the source/drain regions 1122 to expose at least portions of the source/drain regions 1122. The second ILD 1340, the first ILD 1228, and the CESL 1226 may be patterned with the openings, for example, using photolithography and one or more etch processes, such as a dry etch or any suitable anisotropic etch process. The source/drain contact openings allow making electrical contact to the source/drain regions 1122 for the transistors.

After the formation of the source/drain contact openings, conductive features are formed in the openings to the source/drain regions 1122. The conductive features may include a silicide region 1342 formed on the source/drain regions 1122, a barrier layer 1344, and a conductive material 1346 on the barrier layer 1344. The silicide region 1342 may be formed by thermally reacting an upper portion of the source/drain regions 1122 with a metal layer (not shown), such as titanium, tantalum, or the like, formed on the source/drain regions 1122. The barrier layer 1344 is conformally deposited in the source/drain contact openings on the silicide region 1342 and over the second ILD 1340, the first ILD 1228, and the CESL 1226, as shown in FIGS. 13A and 13B. The barrier layer 1344 may be or include titanium nitride, titanium oxide, tantalum nitride, tantalum oxide, any suitable transition metal nitrides or oxides, the like, or any combination thereof, and may be deposited by any suitable deposition technique. The conductive material 1346 may be or include cobalt, tungsten, copper, ruthenium, aluminum, gold, silver, alloys thereof, the like, or a combination thereof, and may be deposited by any suitable deposition technique. After the conductive material 1346 is deposited, excess conductive material 1346 and barrier layer 1344 may be removed by using a planarization process, such as a CMP. The planarization process may remove excess conductive material 1346 and barrier layer 1344 from above a top surface of the first ILD 1228. Hence, top surfaces of the conductive material 1346, the barrier layer 1344, and the second ILD 1340 may be coplanar. The conductive features may be referred to as contacts, plugs, etc.

Various embodiments described herein may offer several advantages. It will be understood that not all advantages have been necessarily described herein, no particular advantage is required for any embodiment, and other embodiments may offer different advantages. As an example, embodiments described herein include improved gate formation methods for forming a dummy gate layer (e.g., a-Si) in high aspect ratio trenches using a cyclic deposition-etch process with cap layer formation, anneal, and cap layer removal processes. The cap layer formation and anneal process can break bonds in the silicon film and can cause the film to reform with reduced voids, seams, and fin bending. Additionally, by reducing or eliminating voids and/or seams, risk of defects in replacement gate structures can be reduced.

In an embodiment, a method for semiconductor processing is provided. The method includes performing a cyclic deposition-etch process to form a conformal film over a bottom surface and along sidewall surfaces of a feature on a substrate. The method includes forming a dielectric cap layer on the conformal film. The method includes performing an anneal process on the conformal film.

In another embodiment, the method includes forming fins on a substrate. Sidewalls of the fins and a bottom surface between the sidewalls of the fins define a trench therebetween. The method includes forming a gate layer in the trench and over the fins. Forming the gate layer includes depositing at least a portion of the gate layer in the trench by performing a cyclic deposition-etch process. The at least the portion of the gate layer merges by lateral growth from the sidewalls of the fins. Forming the gate layer includes forming a dielectric cap layer on the portion of the gate layer. Forming the gate layer includes annealing the portion of the gate layer. The method includes, after forming the gate layer, patterning the gate layer to form a gate structure over the fins.

In yet another embodiment, the method includes forming fins on a substrate. Sidewalls of the fins and a bottom surface define a trench therebetween. The method includes forming a dummy gate structure over the fins. Forming the dummy gate structure includes performing a cyclic deposition-etch process to deposit a first film over the fins. The first film includes a portion of a dummy gate layer. Forming the dummy gate includes forming a dielectric cap layer on the first film. Forming the dummy gate includes annealing the first film. Forming the dummy gate includes removing the dielectric cap layer. Forming the dummy gate includes performing a deposition process to deposit a second film over the first film. The second film includes a remaining portion of the dummy gate layer. The method includes removing the dummy gate structure to form an opening. The method includes forming a replacement gate structure over the fins in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
    performing a cyclic deposition-etch process to form a conformal film over a bottom surface and along sidewall surfaces of a feature on a substrate;
    forming a dielectric cap layer on the conformal film;
    performing an anneal process on the conformal film;
    patterning the conformal film to form a dummy gate;
    forming a dielectric layer along opposing sides of the dummy gate; and
    removing the dummy gate.

2. The method of claim 1, wherein the cyclic deposition-etch process is repeated until lateral growth fronts of the conformal film grown from the respective sidewall surfaces of the feature merge together.

3. The method of claim 1, wherein forming the dielectric cap layer comprises exposing the conformal film to a natural ambient.

4. The method of claim 1, wherein forming the dielectric cap layer comprises depositing the dielectric cap layer on the conformal film.

5. The method of claim 1, wherein the anneal process is performed at an ambient temperature in a range from 300° C. to 800° C.

6. The method of claim 1, wherein the anneal process is performed at an ambient pressure equal to or greater than 1 Torr.

7. The method of claim 1, wherein the anneal process is performed for a duration in a range from 15 seconds to 300 min.

8. The method of claim 1, wherein the anneal process is performed in an ambient gas comprising nitrogen, hydrogen, or a combination thereof.

9. The method of claim 1, wherein the conformal film is deposited as amorphous silicon, and wherein after performing the anneal process, the conformal film is amorphous silicon.

10. The method of claim 1, wherein the conformal film is deposited as amorphous silicon including a first amount of hydrogen, wherein after performing the anneal process, the amorphous silicon includes a second amount of hydrogen, and wherein the second amount of hydrogen is at least 70 percent the first amount of hydrogen.

11. The method of claim 1, wherein after performing the cyclic deposition-etch process and before performing the anneal process, the conformal film includes a first number of voids or seams, and wherein after performing the anneal process, the conformal film includes a second number of voids or seams, the second number being smaller than the first number.

12. The method of claim 1, further comprising:
performing an etch process to remove the dielectric cap layer; and
after removing the dielectric cap layer, performing another deposition process to deposit the conformal film to a target thickness above the feature.

13. A method for semiconductor processing, the method comprising:
forming fins on a substrate, sidewalls of the fins and a bottom surface between the sidewalls of the fins defining a trench therebetween;
forming a dummy gate layer in the trench and over the fins, forming the dummy gate layer comprising:
depositing at least a portion of the dummy gate layer in the trench by performing a cyclic deposition-etch process, the at least the portion of the dummy gate layer merging by lateral growth from the sidewalls of the fins;
forming a dielectric cap layer on the portion of the dummy gate layer; and
annealing the portion of the dummy gate layer;
after forming the dummy gate layer, patterning the dummy gate layer to form a dummy gate structure over the fins; and
after patterning the dummy gate layer, replacing the dummy gate structure with a gate structure.

14. The method of claim 13, further comprising:
etching the dielectric cap layer; and
after etching the dielectric cap layer, depositing a remaining portion of the dummy gate layer on the portion of the dummy gate layer.

15. A method for semiconductor processing, the method comprising:
forming fins on a substrate, sidewalls of the fins and a bottom surface defining a trench therebetween;
forming a dummy gate structure over the fins, wherein forming the dummy gate structure comprises:
performing a cyclic deposition-etch process to deposit a first film over the fins, the first film comprising a portion of a dummy gate layer;
forming a dielectric cap layer on the first film; and
annealing the first film;
removing the dielectric cap layer; and
performing a deposition process to deposit a second film over the first film, the second film comprising a remaining portion of the dummy gate layer;
removing the dummy gate structure to form an opening; and
forming a replacement gate structure over the fins in the opening.

16. The method of claim 15, further comprising forming a spacer structure on a sidewall of the dummy gate structure; wherein:
after the cyclic deposition-etch process, the first film comprises amorphous silicon including a first concentration of hydrogen impurities;
after the annealing, the first film comprises amorphous silicon including a second concentration of hydrogen impurities that is at least 70 percent the first concentration; and
after the spacer structure is formed, the dummy gate layer comprises polycrystalline silicon.

17. The method of claim 15, wherein forming the dielectric cap layer comprises exposing the first film to a natural ambient.

18. The method of claim 15, wherein forming the dielectric cap layer comprises depositing the dielectric cap layer on the first film.

19. The method of claim 15, wherein the annealing is performed in a gas comprising nitrogen, hydrogen, or a combination thereof.

20. The method of claim 15, wherein after the cyclic deposition-etch process and before the annealing, the first film includes a first number of voids or seams, and wherein after the annealing, the first film includes a second number of voids or seams, the second number being smaller than the first number.

* * * * *